United States Patent [19]

Rauner et al.

[11] 4,139,390
[45] Feb. 13, 1979

[54] PRESENSITIZED PRINTING PLATE HAVING A PRINT-OUT IMAGE

[75] Inventors: Frederick J. Rauner; Michael P. Cunningham; Richard C. Van Hanehem, all of Rochester, N.Y.

[73] Assignee: Eastman Kodak Company, Rochester, N.Y.

[21] Appl. No.: 767,273

[22] Filed: Feb. 10, 1977

[51] Int. Cl.² .................................................. G03C 1/68
[52] U.S. Cl. ..................................... 96/91 N; 96/115 R; 96/35.1; 204/159.18; 204/159.23; 204/159.24
[58] Field of Search ............... 96/91 N, 115 R, 115 P, 96/35.1; 204/159.18, 159.23

[56] References Cited

U.S. PATENT DOCUMENTS

| | | | |
|---|---|---|---|
| 3,030,208 | 4/1962 | Schellenberg et al. | 96/115 R |
| 3,113,024 | 12/1963 | Sprague et al. | 96/48 |
| 3,121,632 | 2/1964 | Sprague et al. | 96/48 |
| 3,282,693 | 11/1966 | Sagura et al. | 96/49 |
| 3,591,377 | 7/1971 | Alsup | 96/115 R |
| 3,615,565 | 10/1971 | Gerlack et al. | 96/90 |
| 3,617,278 | 3/1968 | Holstead et al. | 96/33 |
| 3,619,194 | 11/1971 | Mitchell | 96/84 |
| 3,622,320 | 11/1971 | Allen | 96/91 N |
| 3,775,112 | 11/1973 | Alsup et al. | 96/115 R |
| 3,929,489 | 12/1975 | Areesi et al. | 96/115 R |

FOREIGN PATENT DOCUMENTS 881440 9/1971 Canada.

OTHER PUBLICATIONS

Hachk's Chemical Dictionary, 3rd edition, 1944, p. 848.

*Primary Examiner*—Jack P. Brammer
*Attorney, Agent, or Firm*—Dana M. Schmidt

[57] ABSTRACT

A presensitized printing plate contains a leuco dye and an organic azide to provide a print-out image when the presensitized plate is exposed to light. Development of the plate may remove the print-out image but provides a relief image which may be dyed or pigmented. The light sensitive unsaturated materials used to provide the relief image include photocrosslinkable unsaturated polymers containing the moiety

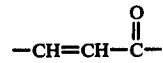

as part of the polymer backbone.

15 Claims, No Drawings

PRESENSITIZED PRINTING PLATE HAVING A PRINT-OUT IMAGE

FIELD OF THE INVENTION

This invention relates to a presensitized printing plate comprising an essentially colorless leuco dye and an organic azide which provide a brillantly colored image upon exposure to light. More particularly, this invention relates to a presensitized printing plate comprising a photocrosslinkable unsaturated polymer and a print-out leuco dye and azide sensitizer, useful in forming lithographic printing plates.

DESCRIPTION OF THE PRIOR ART

In many photographic applications, e.g. lithographic plates, photoresists and the like, it is highly desirable to have a visible indication of exposure before development. This can be a convenience in many instances, such as in step and repeat exposure operations, where the coated elements are stored for some time between exposure and development or where it is desirable to evaluate the image achieved by exposure before development. To provide this capability it is frequently the practice to include in the coating composition an indicator dye that is capable of either print-out or bleachout on exposure of the radiation-sensitive coating produced therefrom. A wide variety of exposure indicator dyes are known to be employable in the art. These exposure indicator dyes include photochromic dyes such as spirobenzopyrans (e.g. 3',3'-dimethyl-6-nitro-1'-phenyl-spiro[2H-1]benzopyran-2,2'-indoline, 5'-methoxycarbonyl-8-methoxy-1',3',3'-trimethyl-6-nitrospiro[2H-1]benzopyran-2,2'-indoline, and the like); pH sensitive dyes such as bis[4,4'-bis(dimethylamino)benzyhydro] ether useful in combination with certain activators; and cyanine dyes such as disclosed in Mitchell U.S. Pat. No. 3,619,194.

The dye selected from such print-out can be one which will produce an image sufficiently intense as to be visible. If the dye itself is not sufficiently intense, an accelerator or sensitizer preferably is included to provide such intensity. The chief problem which arises concerning such print-out accelerators is that their spectral response in many instances significantly overlaps that of the sensitized polymer, resulting in a significant loss in speed for the plate. Particularly this is a problem when separate sensitizers are needed for the photopolymer and the leuco dye. Thus, no more than a one-step decrease in speed can be tolerated when print-out accelerators are added to the light-sensitive composition. Although there are a variety of known leuco dye-sensitizer combinations as disclosed in U.S. Pat. Nos. 3,121,632 (carbonyl sensitizers); 3,615,565 (quinones); 3,113,024 (sulfonyl halides); 3,121,633 (halogenated activators); and Canadian Pat. No. 881,440 (N-methoxides), these are not recited as being useful in lithographic plates. Furthermore, it is difficult to predict which, if any of these can be used with a photocrosslinkable polymer without unduly sacrificing photographic speed.

In U.S. Pat. No. 3,617,278, there is described the use of trihalomethyl-substituted aryl azides as sensitizers for photocrosslinkable polymers in lithographic compositions including leuco dyes used as print-out materials. No separate leuco dye sensitizer is disclosed. Although such aryl azides will, in some instances, sensitize the leuco dye, it has been found as described herein that the aryl azides of that patent are not effective as a sensitizer for the preferred photopolymer of this invention.

U.S. Pat. No. 3,929,489 discloses polyesters used in combination with aryl azide sensitizers, and specifically 2,6-bis(4-azidobenzal)-4-methylcyclohexanone. Leuco dyes are disclosed for print-out, but activators other than azides are used for the leuco dyes. Although thiazoline sensitizers are also suggested for use with the photopolymer, there is no suggestion that thiazolines should be combined with azides as the sensitizer package. Further, if such a package is used, unacceptable reduced speed results as described herein.

U.S. Pat. No. 3,282,693 discloses many of the organic azides found to be useful herein, for use with couplers to cause a print-out in a non-light-sensitive binder. There is no suggestion that these azides will act to sensitize a leuco dye.

SUMMARY OF THE INVENTION

The invention is directed to an imaging process and a presensitized lithographic printing plate comprising a photocrosslinkable unsaturated polymer containing the moiety

as an integral part of the polymer backbone, a thiazoline sensitizer for the polymer, a leuco dye, and a light-sensitive organic azide different from said sensitizer and capable of sensitizing said leuco dye without reducing the speed of said plate by more than one step, said azide having a formula selected from the group consisting of

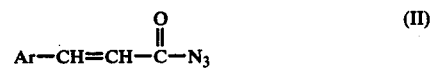

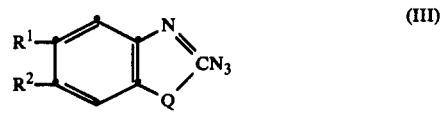

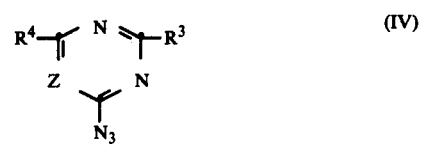

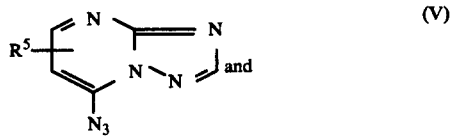

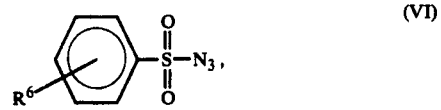

wherein Ar represents aryl; Q is selected from the class consisting of oxygen, sulfur, selenium, and a >NR radical; R is selected from the class consisting of hydrogen, alkyl, aryl, alkylsulfonyl, arylsulfonyl, alkoxy, aroyl, carbalkoxy, and carbamyl; $R^1$ and $R^2$ each is selected from the class consisting of hydrogen, alkyl, alkoxy, aryl, nitro, halogen, and the nonmetallic atoms such that when the $R^1$ and $R^2$ groups are attached to adjacent carbon atoms in the benzene ring, said $R^1$ and $R^2$ groups when taken together with said carbon atoms complete a fused cyclic ring; $R^3$ is selected from the class consisting of azido and alkyl; $R^4$ is selected from the class consisting of azido, alkyl, and amino; Z is selected from the class consisting of the —→CH radial and nitrogen; $R^5$ is selected from the class consisting of hydrogen and alkyl; and $R^6$ is acyl containing from 2 to 5 carbon atoms. Upon imagewise exposure to light, a print-out image is formed and the polymer becomes crosslinked in the exposed areas.

DETAILED DESCRIPTION OF THE INVENTION

It has been found that certain organic azides can be used to sensitize leuco dye print-out materials in a lithographic printing plate, without decreasing the speed of the plate by more than one step. Such print-out can be used, for example, to determine whether proper exposure of the photocrosslinkable polymer has been achieved. In addition, a sensitizer separate from the azide, for the polymer, is incorporated with the polymer, as it has been found that the azide will not sensitizer the preferred photopolymer. The entire composition is preferably coated onto a suitable support from a suitable solvent.

AZIDE SENSITIZERS

Classes of organic azides, which function as a sensitizer for the leuco dye without unduly decreasing the speed of the lithographic plate, as determined by a useful test hereinafter described, include those having the following formulas:

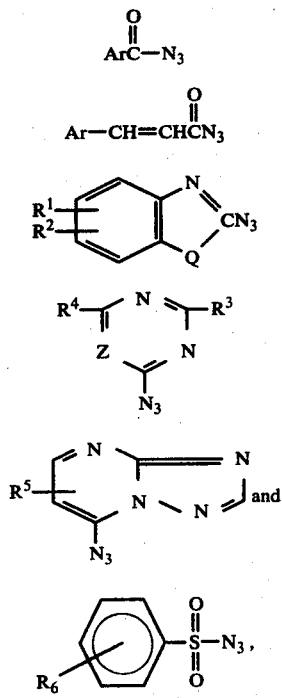

wherein Ar represents an aryl group (e.g. phenyl, α-naphthyl, β-naphthyl, and aryl groups substituted with any of the nucleophilic and electrophilic groups, for example 4-methoxyphenyl, 3-ethylphenyl, 2-propylphenyl, 2-chlorophenyl, 3-fluorophenyl, 4-nitrophenyl, 2-hydroxyphenyl, 3-hydroxyphenyl, 2-aminophenyl, 4-phenoxyphenyl, 4-phenylthiophenyl, 4'-azidophenylthio-4-phenyl, γ-stilbazole, 9-acridine, 2-methoxy-7-chloro-9-acridine, α-hydroxy-β-naphthyl, β-hydroxy-α-naphthyl, etc.); Q represents a group selected from the class consisting of the oxygen atom, the sulfur atom, the selenium atom, a >NR group; R represents a group selected from the class consisting of the hydrogen atom, an alkyl group having 1 to about 5 carbon atoms (e.g. methyl, ethyl, propyl, butyl, etc.), an aryl group having from 6 to 10 carbon atoms (e.g. phenyl, 4-methylphenyl, 3-ethylphenyl, 2-methoxyphenyl, 4-ethoxyphenyl, 4-nitrophenyl, 2-nitrophenyl, etc.), a substituted sulfonyl group (e.g. methylsulfonyl, phenethylsulfonyl, ethylsulfonyl, propylsulfonyl, butylsulfonyl, phenylsulfonyl, p-tolylsulfonyl, m-tolylsulfonyl, etc.), an alkoyl group (e.g. acetyl, trichloroacetyl, trifluoroacetyl, propionyl, butyryl, etc.), an aroyl group (e.g. benzoyl, naphthoyl, etc.), a carbalkoxy group (e.g. carbethoxy, carbomethoxy, carbopropoxy, etc.), a carbamyl group (e.g. carbamyl, methylcarbamyl, propylcarbamyl, butylcarbamyl, hexylcarbamyl, octylcarbamyl, dodecylcarbamyl, carbomethoxymethylcarbamyl, carbethoxymethylcarbamyl, carbobutoxymethylcarbamyl, carbopropoxymethylcarbamyl, carbethoxypropylcarbamyl, carbethoxybutylcarbamyl, carbethoxyhexylcarbamyl, carbethoxyoctylcarbamyl, carbethoxyundecylcarbamyl, carbethoxydodecylcarbamyl, phenylcarbamyl, phenylthiocarbamyl, α-naphthylcarbamyl, α-carbamyldiethylsuccinato, α-carbamylidiethylglutarato, etc.); $R^1$ and $R^2$ each represents a group selected from the class consisting of the hydrogen atom, an alkyl group wherein "alkyl" is used to include substituted alkyl, e.g. methyl, ethyl, propyl, butyl, etc., and any of these with substituents, for example, hydroxy; an aralkyl group (e.g. phenethyl, etc.), an alkoxy group (e.g. methoxy, ethoxy, propoxy, butoxy, etc.), an aralkoxy group (e.g. phenethoxy, etc.), an aryl group (e.g. phenyl, tolyl, etc.), the nitro group, a halogen atom (e.g. chlorine, bromine, fluorine, etc.), and non-metallic atoms such that when $R^1$ and $R^2$ are attached to adjacent carbon atoms in the benzene ring, said non-metallic atoms of $R^1$ and $R^2$ when taken together with the said carbon atoms complete a fused cyclic ring (e.g. phenyl); $R^3$ represents a group selected from the class consisting of the azido group and an alkyl group (e.g. methyl, ethyl, propyl, etc.); $R^4$ represents a group selected from the class consisting of the azido group, an alkyl group (e.g. methyl, ethyl, propyl, etc.), an amino group (e.g. amino, N-phenylamino, N-methylamino, N-propylamino, etc.); Z represents a member selected from the class consisting of the >CH- group and the nitrogen atom; $R^5$ represents a member selected from the class consisting of the hydrogen atom, an alkyl group (e.g. methyl, ethyl, propyl, etc.), and an aralkyl group (e.g. phenethyl, etc.), and $R^6$ is an acyl group containing from 2 to 5 carbon atoms, such as acetamido, ethylcarbonyl and the like.

Specific azides useful in this invention include:
2-azido-1-phenylcarbamylbenzimidazole,
2-azido-1-carbethoxybenzimidazole,
2-azido-p-nitrophenylcarbamylbenzimidazole,
2-azido-1-p-methoxyphenylcarbamylbenzimidazole,
2-azido-1-o-methoxyphenylcarbamylbenzimidazole,
2,4-diazido-6-phenylamino-s-triazine,
2,4,6-triazido-s-triazine, 2,4-diazido-s-triazine,
2,4-diazido-6-methyl-s-triazine,
2,4,6-triazido-pyrimidine,
2-azidonaphtho[1,2-d]oxazole,
2-azidobenzimidazole,
2-azido-1-carbobutoxymethylcarbamylbenzimidazole,
2-azidobenzothiazole,
2-azido-1-acetylbenzimidazole,
2-carbazido-1-naphthol,
2,4-diazido-6-methylpyrimidine,
2-azido-1-carboisopropoxymethylcarbamylbenzimidazole,
2-azido-1-p-toluenesulfonylbenzimidazole,
4-azido-6-chloro-2-methylpyrimidine,
2,4-diazido-6-phenylaminopyrimidine,
2-azido-1-trichloroacetylbenzimidazole,
2-azido-1-trifluoroacetylbenzimidazole,
2-azido-1-(α-carbamyldiethylsuccinato)benzimidazole,
2-azido-1-(α-carbamyldiethylglutarato)benzimidazole,
2-azido-1-undecylcarbamylbenzimidazole,
2-azido-1-carbethoxyundecylcarbamylbenzimidazole,
2-azido-1-α-naphthylcarbamylbenzimidazole,
4-azido-6-methyl-1,3,,3a,7-tetrazaindene, benzoylazide,
2-azido-1-(phenylcarbamido)benzimidazole.

Azido compounds as described herein may be prepared by the methods described in *Chem. Revs.*, 54, No. 1, (February, 1954). See also *J. Amer. Chem. Soc.*, 76, p. 1859 (1954).

TEST PROCEDURE

A useful test to determine which organic azides produce an intensified print-out image without sacrificing lithographic speed by more than one step is one in which a lithographic coating is prepared as follows:

| Part A - Master Test Solution | | |
|---|---|---|
| 246.0 | g | Photopolymer A* |
| 3.2 | g | 2-Benzoylmethylene-1-methylnaphtho[1,2-d]-thiazoline (hereinafter BNTZ) |
| 1.69 | g | Benzoic Acid |
| 0.8 | g | 2,6-Di-t-butyl-p-cresol (hereinafter BHT) |
| 794 | ml | Chlorobenzene |

*Photopolymer A is a polymer prepared by the condensation of equimolar amounts of diethyl-p-phenylenediacrylate and 1,4-bis(β-hydroxyethoxy)cyclohexane, having the formula:

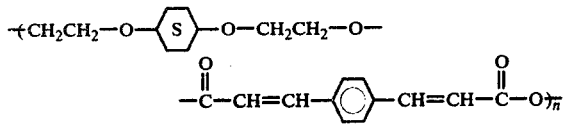

To 500 ml of the test solution is added 0.25 g of leuco propyl violet, and to 100 ml of this solution about 0.135 mmols of the azide candidate are added to make a final test solution. The amount of azide used may vary depending on its efficiency as a sensitizer, and should be that amount which will give an adequate print-out of the leuco dye. On a 25.4 cm × 38 cm grained anodized aluminum plate subbed with a 4 mg/ft² layer of carboxymethylcellulose zinc acetate, the solution is whirl coated at 100 rpm until dry, placed in an oven at 50° C. for 15 minutes to further remove residual solvent, and then removed from the oven and allowed to return to room temperature prior to exposure.

Exposures are made using a NuArc Pulsed Xenon Source at an exposure value of 50 units, through a 0.15 density step tablet in which the steps are numbered sequentially. Speed is indicated by the position of the first solid step to be retained in a processed and inked plate. The higher the number of the step, the faster the speed, since this indicates that adequate insolubilization took place through a higher density area and less exposure is required.

A control for this test comprises the very same final test solution, but without the azide candidate. The speed steps of the solution with the azide should be less, if at all, than that of the control by no more than one step.

LEUCO DYES

The leuco compounds which can be utilized herein include leuco di- and triarylmethane dyes such as aminotriarylmethanes, leuco aminoxanthenes, leuco aminothioxanthenes and other leuco dyes such as amino-9,10-dihydroacridines, aminophenoxazines, aminophenothiazines, aminodihydrophenazines, indamines, aminohydrocinnamic acids, hydrazines, indiqoid dyes, amino-2,3-dihydroanthraquinones, and phenethylanilines.

The leuco bases of arylmethane dyes which are suitable in the composition are those represented by the general formula:

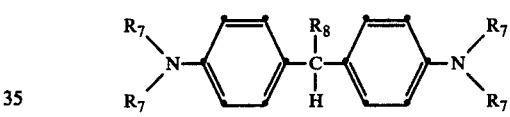

wherein each $R_7$ is selected from the group consisting of H, lower alkyl and aryl and the $R_7$'s may be the same or different, and $R_8$ is selected from the group consisting of H, aryl, alkyl and substituted aryl, such as

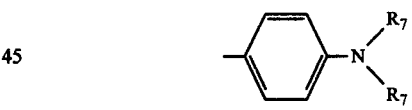

wherein each $R_7$ is selected as described above.

Leuco dyes represented by the above formula which have been found suitable include:
leuco crystal violet,
leuco opal blue,
leuco malachite green,
leuco rosaniline,
leuco pararosaniline,
p,p′,p″-trimethyl leuco opal blue,
p,p′,p″-trichloro leuco opal blue,
p,p′-bis-(dimethylamino phenyl)methane, and other compounds of a similar nature.

Another class of leuco compounds which are suitable in the composition, are generally similar to the leuco arylmethane dyes except that they are characterized by the presence of one or more hetero atoms bridging the two anilino rings and therefore are compounds which may be represented by the general formulas:

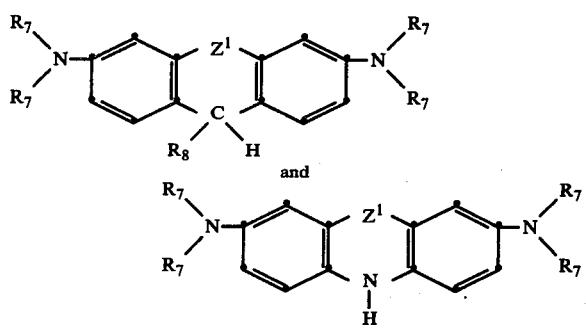

wherein each $R_7$ and $R_8$ is selected as described above; and wherein $Z^1$ represents a member selected from the group consisting of $>O$, $>S$, $>Se$, $>NH$, and

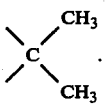

Highly preferred leuco compounds of this class are substituted in the 3,6 positions and include 3,6-bis(dimethylamino)-9-(p-dimethylaminophenyl)-xanthene, 3,6-bis(diethylamino)-9-(p-dimethylaminophenyl)-xanthene, 3,6-bis(diethylamino)-9-(p-diethylaminophenyl)-xanthene, 3,6-bis(dimethylamino)-9-(p-dimethylaminophenyl)-thioxanthene, and 2,7-bis(dimethylamino)-10-p-dimethylaminophenyl-9,10-dihydro-9,9-dimethylanthracene.

Representative leuco dyes in the above described classes which are within the scope of this invention include:

A. AMINOTRIARYLMETHANES bis(4-amino-2-butylphenyl) (p-dimethylaminophenyl)-methane
bis(4-amino-2-chlorophenyl) (p-aminophenyl)methane
bis(4-amino-3-chlorophenyl) (o-chlorophenyl)methane
bis(4-amino-3-chlorophenyl)phenylmethane
bis(4-amino-3,5-diethylphenyl) (o-chlorophenyl)-methane
bis(4-amino-3,5-diethylphenyl) (o-ethoxyphenyl)methane
bis(4-amino-3,5-diethylphenyl) (P-methoxyphenyl)methane
bis(4-amino-3,5-diethylphenyl)phenylmethane
bis(4-amino-ethylphenyl) (o-chlorophenyl)methane
bis(p-aminophenyl) (4-amino-m-tolyl)methane
bis(p-aminophenyl) (o-chlorophenyl)methane
bis(p-aminophenyl) (p-chlorophenyl)methane
bis(p-aminophenyl) (2,4-dichlorophenyl)methane
bis(p-aminophenyl) (2,5-dichlorophenyl)methane
bis(p-aminophenyl) (2,6-dichlorophenyl)methane
bis(p-aminophenyl)phenylmethane-9-methylacridine
bis(4-amino-tolyl) (p-chlorophenyl)methane
bis(4-amino-o-tolyl) (2,4-dichlorophenyl)methane
bis(p-anilinophenyl) (4-amino-m-tolyl)methane
bis(4-benzylamino-2-cyanophenyl) (p-aminophenyl)methane
bis(p-benzylethylaminophenyl) (p-chlorophenyl)methane
bis(p-benzylethylaminophenyl) (p-diethylaminophenyl)methane
bis(p-benzylethylaminophenyl) (p-dimethylaminophenyl) methane
bis(4-benzylethylamino-o-tolyl) (p-methoxyphenyl)methane
bis(p-benzylethylaminophenyl)phenylmethane
bis(4-benzylethylamino-o-tolyl) (o-chlorophenyl)methane
bis(4-benzylethylamino-o-tolyl) (p-diethylaminophenyl) methane
bis(4-benzylethylamino-o-tolyl) (4-diethylamino-o-tolyl) methane
bis(4-benzylethylamino-o-tolyl) (p-dimethylaminophenyl) methane
bis[2-chloro-4-(2-diethylaminoethyl)ethylaminophenyl]-(o-chlorophenyl)methane
bis[p-bis(2-cyanoethyl)aminophenyl]phenylmethane
bis[p-(2-cyanoethyl)ethylamino-o-tolyl](p-dimethylaminophenyl)methane
bis[p-(2-cyanoethyl)methylaminophenyl](p-diethylaminophenyl)methane
bis(p-dibutylaminophenyl) [p-(2-cyanoethyl)methylaminophenyl]methane
bis(p-dibutylaminophenyl) (p-diethylaminophenyl)methane
bis(4-diethylamino-2-butoxyphenyl) (p-diethylaminophenyl)methane
bis(4-diethylamino-2-fluorophenyl)-o-tolylmethane
bis(p-diethylaminophenyl) (p-aminophenyl)methane
bis(p-diethylaminophenyl) (4-anilino-1-naphthyl)methane
bis(p-diethylaminophenyl) (m-butoxyphenyl)methane
bis(p-diethylaminophenyl) (o-chlorophenyl)methane
(p-diethylaminophenyl) (p-cyanophenyl)methane
bis(p-diethylaminophenyl) (2,4-dichlorophenyl)methane
bis(p-diethylaminophenyl) (4-diethylamino-1-naphthyl)methane
bis(p-diethylaminophenyl) (p-dimethylaminophenyl)methane
bis(p-diethylaminophenyl) (4-ethylamino-1-naphthyl)methane
bis(p-diethylaminophenyl)-2-naphthylmethane
bis(p-diethylaminophenyl) (p-nitrophenyl)methane
bis(p-diethylaminophenyl)-2-pyridylmethane
bis(p-diethylamino-m-tolyl) (p-diethylaminophenyl)methane
bis(4-diethylamino-o-tolyl) (o-chlorophenyl)methane
bis(4-diethylamino-o-tolyl) (p-diethylaminophenyl)methane
bis(4-diethylamino-o-tolyl) (diphenylaminophenyl)methane
bis(4-diethylamino-o-tolyl)phenylmethane
bis(4-dimethylamino-2-bromophenyl)phenylmethane
bis(p-dimethylaminophenyl) (4-amino-1-naphthyl)methane
bis(p-dimethylaminophenyl) (p-butylaminophenyl)methane
bis(p-dimethylaminophenyl) (p-scc. butylethylaminophenyl)methane
bis(p-dimethylaminophenyl) (p-chlorophenyl)methane
bis(p-dimethylaminophenyl) (p-diethylaminophenyl)methane bis(p-dimethylaminophenyl) (4-dimethylamino-1-naphthyl) methane
bis(p-dimethylaminophenyl) (6-dimethylamino-m-tolyl) methane
bis(p-dimethylaminophenyl) (4-dimethylamino-o-tolyl) methane
bis(p-dimethylaminophenyl) (4-ethylamino-1-naphthyl) methane
bis(p-dimethylaminophenyl) (p-hexyloxyphenyl)methane
bis(p-dimethylaminophenyl) (p-methoxyphenyl)methane
bis(p-dimethylaminophenyl) (5-methyl-2-pyridyl)methane
bis(4-diethylamino-2-ethoxyphenyl) (4-diethylaminophenyl)methane
bis(p-dimethylaminophenyl)-2-quinolylmethane
bis(p-dimethylaminophenyl)-o-tolylmethane
bis(p-dimethylaminophenyl))1,3,3-trimethyl-2-indolinylidenemethyl)methane
bis(4-dimethylamino-o-tolyl) (p-aminophenyl)methane
bis(4-dimethylamino-o-tolyl) (o-bromophenyl)methane
bis(4-dimethylamino-o-tolyl) (o-cyanophenyl)methane
bis(4-dimethylamino-o-tolyl) (o-fluorophenyl)methane
bis(4-dimethylamino-o-tolyl)-1-naphthylmethane
bis(4-dimethylamino-o-tolyl)phenylmethane
bis(p-ethylaminophenyl) (o-chlorophenyl)methane
bis(4-ethylamino-m-tolyl) (o-methoxyphenyl)methane
bis(4-ethylamino-m-tolyl) (p-methoxyphenyl)methane
bis(4-ethylamino-m-tolyl) (p-dimethylaminophenyl)methane
bis(4-ethylamino-m-tolyl) (p-hydroxyphenyl)methane
bis[4-ethyl(2-hydroxyethyl)amino-m-tolyl](p-diethylaminophenyl)methane
bis[p-(2-hydroxyethyl)aminophenyl](o-chlorophenyl)methane
bis[p-bis(2-hydroxyethyl)aminophenyl](4-diethylamino-o-tolyl)methane
bis[p-(2-methoxyethyl)aminophenyl]phenylmethane
bis(p-methylaminophenyl) (o-hydroxyphenyl)methane
bis(p-propylaminophenyl) (m-bromophenyl)methane
tris(4-amino-o-tolyl)methane
tris(4-anilino-o-tolyl)methane
tris(p-benzylaminophenyl)methane
tris[4-bis(2-cyanoethyl)amino-o-tolyl]methane
tris[p-(2-cyanoethyl)ethylaminophenyl]methane
tris(p-dibutylaminophenyl)methane
tris(p-di-t-butylaminophenyl)methane
tris(p-dimethylaminophenyl)methane
tris(4-diethylamino-2-chlorophenyl)methane
tris(p-diethylaminophenyl)methane
tris(4-diethylamino-o-tolyl)methane
tris(p-dihexylamino-o-tolyl)methane
tris(4-dimethylamino-o-tolyl)methane
tris(p-hexylaminophenyl)methane
tris[p-bis(2-hydroxyethyl)aminophenyl]methane
tris(p-methylaminophenyl)methane
tris(p-dioctadecylaminophenyl)methane

B. AMINOXANTHENES 3-amino-6-dimethylamino-2-methyl-9-(o-chlorophenyl)xanthene
3-amino-6-dimethylamino-2-methyl-9-phenylxanthene
3-amino-6-dimethylamino-2-methylxanthene
3,6-bis(diethylamino)-9-(o-chlorophenyl)xanthene
3,6-bis(diethylamino)-9-hexylxanthene
3,6-bis(diethylamino)-9-(o-methoxycarbonylphenyl) xanthene
3,6-bis(diethylamino)-9-methylxanthene
3,6-bis(diethylamino)-9-phenylxanthene
3,6-bis(diethylamino)-9-o-tolyxanthene
3,6-bis(dimethylamino)-9-(o-chlorophenyl)xanthene
3,6-bis(dimethylamino)-9-ethylxanthene
3,6-bis(dimethylamino)-9-(o-methoxycarbonylphenyl) xanthene
3,6-bis(dimethylamino)-9-methylxanthene

C. AMINOTHIOXANTHENES 3,6-bis(diethylamino)-9-(o-ethoxycarbonylphenyl) thioxanthene
3,6-bis(dimethylamino)-9-(o-methoxycarbonylphenyl) thioxanthene
3,6-bis(dimethylamino)thioxanthene
3,6-dianilino-9-(o-ethoxycarbonylphenyl)thioxanthene

D. Amino-9,10-dihydroacridines 3,6-bis(benzylamino)-9,10-dihydro-9-methylacridine
3,6-bis(diethylamino)-9-hexyl-9,10-dihydroacridine
3,6-bis(diethylamino)-9,10-dihydro-9-methylacridine
3,6-bis(diethylamino)-9,10-dihydro-9-phenylacridine
3,6-diamino-9-hexyl-9,10-dihydroacridine
3,6-diamino-9,10-dihydro-9-methylacridine
3,6-diamino-9,10-dihydro-9-phenylacridine
3,6-bis(dimethylamino)-9-hexyl-9,10-dihydroacridine
3,6-bis(dimethylamino)-9,10-dihydro-9-methylacridine

E. AMINOPHENOXAZINES 3,7-bis(diethylamino)phenoxazine
9-dimethylamino-benzo[a]phenoxazine

F. AMINOPHENOTHIAZINES 3,7-bis(benzylamino)phenothiazine

G. AMINODIHYDROPHENAZINES 3,7-bis(benzylethylamino)-5,10-dihydro-5-phenylphenazine
3,7-bis(diethylamino)-5-hexyl-5,10-dihydrophenazine
3,7-bis(dihexylamino)-5,10-dihydrophenazine
3,7-bis(dimethylamino)-5-(p-chlorophenyl)-5,10-dihydrophenazine
3,7-diamino-5-(o-chlorophenyl)-5,10-dihydrophenazine
3,7-diamino-5,10-dihydrophenazine
3,7-diamino-5,10-dihydro-5-methylphenazine
3,7-diamino-5-hexyl-5,10-dihydrophenazine-3,7-bis(-dimethylamino)-5,10-dihydrophenazine
3,7-bis(dimethylamino)-5,10-dihydro-5-phenylphenazine
3,7-bis(dimethylamino)-5,10-dihydro-5-methylphenazine

H. AMINODIPHENYLMETHANES 1,4-bis[bis-p(diethylaminophenyl)methyl]piperazine bis(p-diethylaminophenyl)anilinomethane
bis(p-diethylaminophenyl)-1-benzotriazolylmethane
bis(p-diethylaminophenyl)-2-benzotriazolylmethane
bis(p-diethylaminophenyl) (p-chloroanilino)methane
bis(p-diethylaminophenyl) (2,4-dichloroanilino)methane
bis(p-diethylaminophenyl) (methylamino)methane
bis(p-diethylaminophenyl) (octadecylamino)methane
bis(p-dimethylaminophenyl)aminomethane
bis(p-dimethylaminophenyl)anilinomethane
1,1-bis(dimethylaminophenyl)ethane
1,1-bis(dimethylaminophenyl)heptane
bis(4-methylamino-m-tolyl)aminoethane

I. LEUCO INDAMINES 4-amino-4'-dimethylaminodiphenylamine
p-(p-dimethylaminoanilino)phenol

J. AMINOHYDROCINNAMIC ACIDS (CYANOETHANES, LEUCO METHINES)

4-amino-α,β-dicyanohydrocinnamic acid, methyl ester
4-anilino-α,β-dicyanohydrocinnamic acid, methyl ester
4-(p-chloroanilino)-α,β-dicyanohydrocinnamic acid, methyl ester
α-cyano-4-dimethylaminohydrocinnamide
α-cyano-4-dimethylaminohydrocinnamic acid, methyl ester
α,β-dicyano-4-diethylaminohydrocinnamic acid, methyl ester
α,β-dicyano-4-dimethylaminohydrocinnamide
α,β-dicyano-4-dimethylaminohydrocinnamic acid, methyl ester
α,β-dicyano-4-dimethylaminohydrocinnamic acid
α,β-dicyano-4-dimethylaminohydrocinnamic acid, hexyl ester
α,β-dicyano-4-hexylaminohydrocinnamic acid, methyl ester
α,ββ-dicyano-4-hexylaminohydrocinnamic acid, methyl ester
α,β-dicyano-4-methylaminocinnamic acid, methyl ester p-(2,2-dicyanoethyl)-N,N-dimethylaniline
4-methoxy-4'-(1,2,2-tricyanoethyl)azobenzene
4-(1,2,2-tricyanoethyl)azobenzene
p-(1,2,2-tricyanoethyl)-N,N-dimethylaniline

K. HYDRAZINES 1-(p-diethylaminophenyl)-2-(2-pyridyl)hydrazine
1-(p-dimethylaminophenyl)-2-(2-pyridyl)hydrazine
1-(3-methyl-2-benzothiazolyl)-2-(4-hydroxy-1-naphthyl)hydrazine
1-(2-naphthyl)-2-phenylhydrazine
1-p-nitrophenyl-2-phenylhydrazine
1-(1,3,3-trimethyl-2-indolinyl)-2-(3-N-phenylcarbamoyl-4-hydroxy-1-naphthyl)hydrazine

L. LEUCO INDIGOID DYES

M. AMINO-2,3-DIHYDROANTHRAQUINONES 1,4-dianilino-2,3-dihydroanthraquinones
1,4-bis(ethylamino)-2,3-dihydroanthraquinone

N. PHENETHYLANILINES

N-(2-cyanoethyl)-p-phenethylaniline
N,N-diethyl-p-phenylethylaniline
N,N-dimethyl-p-[2-(1-naphthyl)ethyl]aniline.

Although most of the aforedescribed leuco dyes produce no image whatsoever upon exposure, some will produce a faint image. It is this faint image that is to be intensified by the azide sensitizer, or revealed if none is formed in the absence of the sensitizer.

Preferred concentrations of the leuco dye range from about 1 to about 4% by weight of the total dry coating weight. Highly preferred within this range is a 2% concentration.

POLYMER

The photocrosslinkable polymer is, of course, the composition which, upon imagewise exposure, generates the imaging areas. For lithographic applications, only the unexposed, noncrosslinked portions of such a polymer respond to a developer solution, leaving behind the crosslinked portions that are ink-receptive. Particularly useful light-sensitive polymers are polyesters, polycarbonates and polysulfonates which contain the light-sensitive grouping

as an integral part of the polymer backbone. Polymers containing this light-sensitive grouping are described in U.S. Pat. Nos. 3,030,208; 3,453,237, issued July 1, 1969; and 3,622,320 issued Nov. 23, 1971. The polyesters can be prepared by condensing a suitable polycarboxylic acid, or the lower alkyl ester or chloride of a suitable polycarboxylic acid with a suitable polyhydric alcohol, in the presence of an esterification catalyst. Highly preferred polyesters are those with at least one saturated carbocyclic ring in the repeating unit of the polymer. Highly useful examples of such preferred polyesters are those containing a repeating unit having the formulas

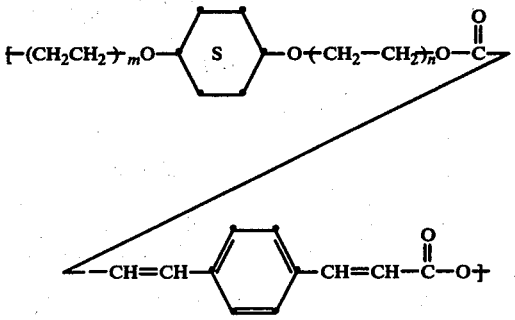

where m and n are the same or different and are equal to 1, 2 or 3.

The polycarbonates can be prepared by reaction of one or more polyhydric alcohols with phosgene, or by reaction of a bischloroformate of a polyhydric alcohol with another polyhydric alcohol. The light-sensitive grouping can be contained either in the polycarboxylic acid or in the polyhydric alcohol. Typical polycarboxylic acids include p-phenylene diacrylic acid, fumaric acid, succinic acid, adipic acid, terephthalic acid, etc., and mixtures of these acids. Typical polyhydric alcohols include ethylene glycol, 1,3-propane diol, 1,6-hexane diol, neopentyl glycol, 1,4-cyclohexanedimethanol, 1,4-bis-(β-hydroxyethoxy)-cyclohexane, diphenylol propane, tetrachlorodiphenylolpropane, dihydroxy chalcones and dihydroxy dibenzal ketones such as divanillal cyclopentanone, 4,4'-dihydroxychalcone, etc., as well as mixtures of these diols.

Spectral sensitivity can be stimulated in the crosslinkable polymer by incorporating a sensitizer. Suitable sensitizers include anthrones, such as 1-carbethoxy-2-keto-3-methyl-2-azabenzanthrone, benzanthrone and those anthrones disclosed in U.S. Pat. No. 2,670,285; nitro sensitizers such as those disclosed in U.S. Pat. No. 2,610,120; triphenylmethanes such as those disclosed in U.S. Pat. No. 2,690,966; quinones such as those disclosed in U.S. Pat. No. 2,670,286; cyanine dye sensitizers; naphthone sensitizers such as 6-methoxybeta-2-furyl-2-acrylonaphthone; pyrylium or thiapyrylium salts, such as 2,6-bis(p-ethoxyphenyl)-4-(p-n-amyloxyphenyl)-thiapyrylium perchlorate and 1,3,5-triphenylpyrylium fluoroborate; furanone; anthraquinones such as 2-chloroanthraquinone; thiazoles such as 2-benzoylcarbethoxymethylene-1-methyl-betanaphthothiazole and methyl 2-(N-methylbenzothiazolylidene)dithioacetate; methyl 3-methyl-2-benzothiazolidene dithioacetate; thiazolines such as 3-ethyl-2-benzoylmethylenenaphtho[1,2-d]-thiazoline, 2-[bis(2-furoyl)methylene]-1-methylnaphtho[1,2-d]thiazoline; benzothiazoline, (2-benzoylmethylene)-1-methyl-beta-naphthothiazoline; 1,2-dihydro-1-ethyl-2-phenacylidenenaphtho[1,2-d]-thiazole; naphthothiazoline; quinolizones, Michler's ketone, and Michler's thioketone, as well as other sensitizers, such as those disclosed in French Pat. Nos. 1,238,262; 1,089,290 and 1,086,257 and U.S. Pat. Nos. 2,732,301; 2,670,285 and 2,732,301.

The polymer sensitizer can be present in the coating composition in any desired concentration effective to stimulate crosslinking in response to radiation. It is generally preferred to incorporate the sensitizer in a concentration of from 0.01 to 20 percent by weight based on the weight of the crosslinking polymer.

Binders or extenders can also be used with the photopolymer. Representative binders that are suitable for use in the present composition include: styrene-butadiene copolymers; silicone resins; styrene-alkyd resins; silicone-alkyd resins; soya-alkyd resins; poly(vinyl chloride); poly(vinylidene chloride); vinylidene chloride-acrylonitrile copolymers; poly(vinyl acetate); vinyl acetate-vinyl chloride copolymers; poly(vinyl acetals), such as poly(vinyl butyral); polyacrylic and methacrylic esters, such as poly(methylmethacrylate), poly(n-butylmethacrylate), poly(isobutylmethacrylate), etc.; polystyrene, nitrated polystyrene; polymethylstyrene; isobutylene polymers; polyesters, such as poly(ethylenealkaryloxyalkylene terephthalate); phenolformaldehyde resins; ketone resins; polyamides; polycarbonates; polythiocarbonates; poly(ethyleneglycol-co-bis-hydroxyethoxyphenyl propane terephthalate); copolymers of vinyl haloarylates and vinyl acetate such as poly(vinyl-m-bromobenzoate-co-vinylacetate); ethyl cellulose, poly(vinyl alcohol), cellulose acetate, cellulose nitrate, chlorinated rubber, gelatin, etc. Methods of making resins of this type have been described in the prior art, for example, styrene-alkyd resins can be prepared according to the method described in U.S. Pat. Nos. 2,361,019 and 2,258,423. Suitable resins of the type contemplated for use are sold under such trade names as Vitel PE-101, Cymac, Piccopale 100, Piccolastic A-50, Saran F-220, Lexan 105 and Lexan 145. Other types of binders which can be used include such materials as paraffin, mineral waxes, etc.

To the above-described composition, various addenda can be included, primarily for stabilizing the composition or to enhance the polymer's coating properties. Examples of such addenda include certain reductones, as described in U.S. Pat. No. 3,920,457, as stabilizers. For example, a stabilizer may be used selected from the group consisting of reductones of the structure:

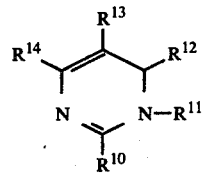

and

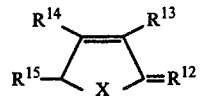

wherein X is oxygen or alkylene, $R^{10}$ and $R^{11}$ are independently selected from the group consisting of hydrogen and alkyl, $R^{12}$ is oxygen or an imino group, $R^{13}$ and $R^{14}$ are independently selected hydroxyl or amino groups, but at least one of $R^{13}$ and $R^{14}$ must be hydroxyl, $R^{15}$ is aryl, substituted aryl or

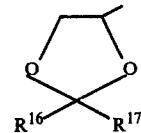

wherein $R^{16}$ and $R^{17}$ are independently selected alkyl groups; whereby said leuco dye is stabilized against discoloration prior to coating and dark thermal reactions leading to background coloration of said element of aging are suppressed.

Especially preferred reductones for use in the practice of this invention include 5,6-isopropylidene ascorbic acid, 3,4-dihydroxy-5-phenyl-2,5-dihydro-2-furanone, 5-imino-3,4-dihydroxy-2-phenyl-2,5-dihydrofuran, 2-isopropyl-4,5,6-trihydroxy pyrimidine and 4,5-dihydroxy-1-methyl-2-propyl-6-pyrimidone.

If used, it is preferred that the reductone be present in a concentration of from about 2 to about 25 percent by weight based upon the weight of the leuco dye. The most preferred weight percent range for the reductone, based upon the weight of the leuco compound, is from about 5 to about 20.

Other stabilizers which can, but need not, be incorporated, include polymer anti-oxidants such as 2,6-di-t-butyl-p-cresol.

Particularly advantageous coating compositions contain at least one other film-forming polymeric resin in addition to the crosslinkable polymers described above. These additional polymeric resins are typically not radiation-sensitive, although mixtures of radiation-sensitive resins can be employed and are usually selected from those resins which are soluble in the coating solvent. The amount of resin employed can be varied, depending upon the resin, the crosslinkable polymer, the coating solvent, and the coating method and application chosen. Useful results can be obtained using coating compositions containing up to 5 parts of resin per part of crosslinkable polymer on a weight basis. Generally preferred coating compositions are those that contain from 0.05 to 1.0 part resin per part of crosslinkable polymer on a weight basis.

Exemplary of film-forming resins useful as additives in the coating compositions of this invention are phenolic resins, such as novolac and resole resins. These resins are particularly useful in improving the resistance of coatings to etchants when the coating composition is used as a photo-resist composition. Where it is desired to control wear resistance of the coatings produced from the coating composition, as in lithographic and relief plates, it can be desirable to incorporate resins, such as epoxy resins; hydrogenated rosin; poly(vinyl acetals); and acrylic polymers and copolymers, such as poly(methyl methacrylate), polystyrene, acrylates of the type disclosed in British Pat. No. 1,108,383, poly(alkylene oxides) and poly(vinyl alcohol). The crosslinkable polymers are also generally compatible with linear polyesters.

Solvents which are inert toward the leuco dye, the binder and the organic azide are usually employed to dissolve these components and thereby mix them together and to provide a fluid medium for a convenient and ready application of the photosensitive composition to substrates. Among the solvents which may be employed in preparing the compositions of this invention are amides such as formamides, N,N-dimethylformamide, N,N-dimethylacetamide, alcohols such as methanol, ethanol, 1-propanol, 2-propanol, butanol; ketones such as acetone, 2-butanone, etc.; esters such as ethylacetate, ethylbenzoate, etc.; ethers such as tetrahydrofuran, dioxane, etc.; chlorinated aliphatic hydrocarbons such as methylene chloride, ethylene chloride, dichloroethane, etc.; aromatic hydrocarbons such as benzene, toluene, etc.; and other common solvents such as dimethylsulfoxide, o-dichlorobenzene, dicyanocyclobutane, 1-methyl-2-oxohexamethyleneimine, and various mixtures of the solvents.

In preparing the compositions disclosed herein, useful results are obtained when the leuco dye and organic azide are mixed in weight ratios within the range from about 10:1 to about 1:10. The preferred ratio range is 2:1 to 1:2. The binder, when used, is employed in an amount varying from about 0.5 part to 30 parts by weight per part of combined weight of leuco dye and organic azide. The combined weight of leuco dye and organic azide in the composition ranges from about 1 weight percent to about 99 weight percent. A preferred combined weight range is from about 2 weight percent to about 60 weight percent.

When the compositions are coated and dried on a suitable support, typical coating thicknesses can be for example from about 0.05 to 10.0 microns or greater, which thicknesses of from 0.1 to 5.0 microns being preferred from lithographic plate applications.

In applying the composition to a supporting substrate, the composition can be sprayed, brushed, applied by a roller or immersion coater, flowed over the surface, picked up by immersion, impregnated or spread by other means. Elements thus formed are dried at room temperature, under vacuum or at elevated temperature.

Suitable support materials can be chosen from among a variety of materials which do not directly chemically react with the coating composition. Such support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic resin and polymeric materials such as poly(alkyl acrylates), e.g., poly(methyl methacrylate), polyester film base— e.g., poly(ethylene terephthalate), poly(vinyl acetals), polyamides—e.g., nylon and cellulose ester film base— e.g., cellulose nitrate, cellulose acetate, cellulose acetate propionate, cellulose acetate butyrate and the like.

Specific support materials which are useful in forming printing plates—particularly lithographic printing plates—include supports such as zinc, anodized aluminum, grained aluminum, copper and specially prepared metal and paper supports; superficially hydrolyzed cellulose ester films; and polymeric supports such as polyolefins, polyesters, polyamide, etc.

The supports can be preliminarily coated—i.e., before receipt of the radiation-sensitive coating—with known subbing layers such as copolymers of vinylidene chloride and acrylic monomers—e.g., acrylonitrile, methyl acrylate, etc. and unsaturated dicarboxylic acids such as itaconic acid, etc.; carboxymethyl cellulose; gelatin; polyacrylamide; and similar polymer materials.

The support can also carry a filter or antihalation layer compound of a dyed polymer layer which absorbs the exposing radiation after it passes through the radiation-sensitive layer and eliminates unwanted reflection from the support. A yellow dye in a polymeric binder, such as one of the polymers referred to above as suitable subbing layers, is an especially effective antihalation layer when ultraviolet radiation is employed as the exposing radiation.

The elements prepared as described above are exposed to a pattern of actinic radiation and the image is formed directly on the support. The exposure can be by contact printing techniques, by lens projection, by reflux, by bireflex, from an image-bearing original, or by any other known techniques.

The exposed radiation-sensitive elements of this invention can be developed by flushing, soaking, swabbing or otherwise treating the radiation-sensitive layer with a solution (hereinafter referred to as a developer) which selectively solubilizes (i.e. removes) the unexposed areas of the radiation-sensitive layers. The developer is typically an aqueous alkaline solution having a pH in the range of from about 9 to 14. Basicity can be imparted to the developer by the incorporation of soluble inorganic basic compounds such as alkali metal hydroxides, phosphates, sulfates, silicates, carbonates and the like as well as combinations thereof. Alternatively or in combination, basic, soluble organic substances such as amines—e.g., triethanol amine, diethylene amine, diethylaminoethanol, etc.—can be incorporated.

In a preferred form the developer includes a miscible combination of water and alcohol as a solvent system. The proportions of water and alcohol can be varied widely but are typically within the range of from 20 to 80 percent by volume water and from 80 to 20 percent by volume alcohol, based on the total developer volume. Most preferably, the water content is maintained within the range of from 40 to 60 percent by volume, based on total volume, with the remainder of the solvent system consisting essentially of alcohol. Any alcohol or combination of alcohols that does not chemically adversely attack the radiation-sensitive coating during development and that is miscible with water in the proportions chosen for use can be employed. Exemplary of useful alcohols are glycerol, benzyl alcohol, 2-phenoxyethanol, 1,2-propanediol, sec-butyl alcohol and ethers derived from alkylene glycols—i.e. dihydroxy poly(alkylene oxides)—e.g., dihydroxy poly(ethylene oxide), dihydroxy poly(propylene oxide), etc.

Lactone developers of the type described in U.S. Pat. No. 3,707,373 can also be used with the litho plates of this invention.

It is recognized that the developer can, optionally, contain additional addenda. For example, the developer can contain dyes and/or pigments. Where the developer is being used to develop the image of a lithographic plate, it can be advantageous to incorporate into the developer anti-scumming and/or anti-blinding agents, as is well recognized in the art.

The element can then be treated in any known amount consistent with its intended use. For example, printing plates are typically subjected to desensitizing etches. Where the developed radiation-sensitive coating layer forms a resist layer, the element is typically subjected to acidic or basic etchants and to plating baths.

The following examples are included for a further understanding of the invention.

EXAMPLE 1

| Use of a leuco dye in a lithographic plate | |
|---|---|
| A photosensitive composition was prepared as follows: Photopolymer A of the Test Solution described above | 40.0 g |
| BNTZ | 3.2 g |
| Benzoic Acid | 1.6 g |
| BHT | 0.8 g |
| Chlorobenzene | 1.0 l |

To 10 ml of the above composition was added 10 mg of leuco crystal violet. The resulting solution was whirl-coated on anodized aluminum at 100 rpm until dry and exposed to a carbon arc ultraviolet source in a vacuum printing frame for 2 minutes. A faint blue print-out image was observed in the light struck area. With no leuco dye present, no printout was observed.

EXAMPLES 2–5

Use of a leuco dye and an azide in a lithographic Plate

To 10 ml portions of the photosensitive composition of Example 1 were added 5 mg of leuco crystal violet and 5 mg of various azides. The resulting compositions were coated and exposed as described in Example 1.

In determining relative speed ratings, exposures are made using a 0.15 density step tablet in which steps are numbered sequentially.

The results are listed in Table 1:

Table 1

| Example | Azide Used | Print-Out Intensity | Speed Steps |
|---|---|---|---|
| Control A | None (control) | faint | 6 |
| Control B | Anthraquinone-2-sulfonylazide | very good | 2 |
| 2 | 2-azido-1-carboethoxymethyl-carbamylbenzimidazole | very good | 5 |
| 3 | 4-acetamidobenzene-sulfonylazide | very good | 5 |
| 4 | Cinnamoylazide | very good | 6 |
| 5 | 4-azido-6-methyl-1,3,3a,7-tetrazaindene | good | 5 |

The azide of control B is another example of one which, through providing considerable image intensification, does so at the expense of more than one speed step, and is therefore unsatisfactory.

EXAMPLE 6

Use of leuco dye and azide in a pigmented lithographic plate

To 20 ml of the light-sensitive composition of Example 1 was added 10 mg of leuco crystal violet, 5 mg of 2-azido-1-carboethoxymethyl carbamyl benzimidazole and 1.0 g of a dispersion of Monastral Green pigment in dichloroethane (11.1% solids). The resulting dispersion was coated and exposed as described in Example 1. A strong violet printout on a green background resulted with a difference of reflection density between the image and non-image areas of 0.05 density units to yellow light. The plate was developed by a developer of the following formulation, hereinafter identified as "LN":

| LN Developer | |
|---|---|
| 4-Butyrolactone | 1000.0 ml |
| Zonyl A** | 10.0 ml |
| Methyl Abietate | 10.0 ml |
| Staybellite Resin (Hydrogenated Rosin sold by Hercules Powder Co.) | 1.0 g |
| Glycerol | 100.0 ml |
| Water | 100.0 ml |
| Phosphoric Acid | 25.0 ml |
| Triethanolamine | 12.5 ml |

**Zonyl A is a non-ionic ethylene oxide-ester condensate made by the E.I. duPont de Nemours Co.

Swabbing the plate with the LN developer resulted in the print-out image being leached out of the image area. The final developed image was green in color.

EXAMPLES 7–10

| Use in a dyed lithographic plate | |
|---|---|
| A photosensitive composition was prepared as follows: Photopolymer B*** | 25.0 ml |
| (2-Benzoylmethylene)-1-ethyl-naphthol[1,2-d]thiazoline | 1.0 g |
| 2,6-Di-t-butyl-p-cresol | 1.0 g |
| Benzoic Acid | 1.0 g |
| Dichloroethane | 1.0 l |

***Photopolymer B is poly[1,4-cyclohexylene-bis(oxyethylene)-p-phenylenediacrylate]-co-3,3′[(sodio-iminodisulfonyl)benzoate]. The polymer is disclosed in U.S. Pat. No. 3,929,489 issued December 13, 1975.

To 10 ml of the above composition was added 5.0 mg of leuco crystal violet, 1.25 mg of Safranin O (Color Index No. 50240), and 5 mg of each of the azides of Examples 2–5. The resulting solution was coated and exposed as described in Example 1. A print-out image resulted in the light struck areas superimposed on a red background. A developer solution was prepared as follows:

| | |
|---|---|
| Glycerol | 792 ml |
| 2-Phenoxyethanol | 96 ml |
| 2-Ethoxyethanol | 240 ml |
| Water | 1188 ml |
| 2-Diethylaminoethanol | 84 ml |

Swab development of the plate left the print-out image on the aluminum support, due to the highly aqueous nature of this developer. The print-out intensities obtained after coating and exposure were identical to those obtained in Examples 2–5. For example in the case of 2-azido-1-carboethoxymethylcarbamyl benzimidazole, a strong violet print-out image superimposed on a red background was obtained.

EXAMPLES 11-15

Preferred leuco dye — azide ratio

To 20 ml portions of the light-sensitive composition of Example 1 was added a 1.0 g portion of the dispersion of of Example 6 and varying amounts of 2-azido-1-carbethoxymethylcarbamyl benzimidazole. The level of leuco dye was maintained at the preferred level of 2%. The resulting dispersions were coated and exposed as described in Example 1. Speed steps were measured as for Examples 2-5.

The azide concentrations and results obtained were as follows:

| Example | Azide-Leuco Dye Ratio | Δd | Speed Steps |
|---|---|---|---|
| 11 | 0.5 to 1.0 | 0.04 | 8½ |
| 12 | 1.0 to 1.0 | 0.04 | 8½ |
| 13 | 1.5 to 1.0 | 0.04 | 8½ |
| 14 | 2.0 to 1.0 | 0.05 | 8½ |
| 15 | 3.0 to 1.0 | 0.06 | 8½ |

Acceptable results are obtained over a wide range of azide concentration. A 1:1 azide-leuco dye ratio is highly preferred.

EXAMPLE 16

Use of other leuco dyes

Other leuco dyes examined and found to be acceptable were tris(p-diethylaminophenyl)methane, tris(p-dipropylaminophenyl)methane, bis(p-diethylaminophenyl)p-diethylaminotolyl methane, bis(p-diethylamino-o-tolyl)p-diethylaminophenyl methane, tris(p-diethylamino-o-tolyl)methane, tris(p-diethylamino-o-chlorophenyl)methane, bis(p-diethylamino-o-ethoxy phenyl) p-diethylaminophenyl methane.

COMPARATIVE EXAMPLES CE-1 and CE-2

To illustrate the manner in which certain aryl azides interfere with the photoresponsiveness of the polymer, examples were coated, one (CE 1) without any leuco dye sensitizer as a control. The composition of the coatings, and the method of coating, exposure and development were those used for the master test solution described above under "Test Procedure," with or without a leuco dye sensitizer added. The amount of azide used, and the speed step results are as follows:

| Example | Leuco Dye Sensitizers | Amount of Azide | Speed Steps |
|---|---|---|---|
| CE 1 | None (control) | none | 7 |
| CE 2 | 2,6-bis(4-azidobenzal)-4-methylcyclohexene (U.S. Pat. No. 3,929,489) | 0.05 g | 5 |

The print-out image was intensified by the azide for CE 2, but at a cost of 2 steps in speed — an undesirable result.

COMPARATIVE EXAMPLES CE-3 THROUGH CE-4

To illustrate that two different sensitizers are needed for the preferred photopolymer and the leuco dye, these examples combined individually an azido-substituted trihalo-methane of U.S. Pat. No. 3,617,278, as well as a preferred leuco dye sensitizer of the invention, with Photopolymer A. The following master solution was prepared as a control No. 1:

| Master Solution | | |
|---|---|---|
| Photopolymer A of "Test Solution", above | 123.0 | |
| Benzoic acid | 0.845 | g |
| BHT | 0.4 | g |
| Chlorobenzene | 397.0 | ml |

As a second control No. 2, 1.6 g of BNTZ was added to the master solution. CE-3 was prepared by adding to the master solution 1.6 g of 6-azido-5-bromo-2-tribromomethyl quinoline. CE-4 was prepared by adding to the master solution 1.6 g of 1-(carbobutoxymethyl carbamyl)-2-azidobenzimidazole. All 4 solutions were used to form light-sensitive coatings by whirl coating the solutions at 100 rpm on 10" × 15" grained, anodized aluminum supports subbed with a 4 mg/ft$^2$ layer of carboxymethyl cellulose:zinc acetate coating. When dry, the coatings were placed in an oven at 50° C. for 15 minutes to further remove residual solvent. The coatings were then removed from the oven and allowed to return to room temperature prior to exposure. Exposures were made using a NuArc Pulsed Xenon Source at an exposure value of 50 units.

The plates were developed with LN Developer for 1 minute, then treated with a finisher and buffed dry. Rub-up ink was then applied to facilitate speed determination. The digit under the speed column (see attached table) represents the first solid step.

Although no aging tests were conducted, generally aging results in a reduction in speed of the tri-halo compounds.

| Speed Results | |
|---|---|
| Example | Speed |
| Control No. 1 | Slight response, but no solid steps recorded |
| Control No. 2 | 7 |
| CE-3 | No measurable response |
| CE-4 | No measurable response |

It is evident from the above that both the tri-halo compounds of U.S. Pat. No. 3,617,278 and a preferred azido sensitizer of the invention, although sensitizers for the leuco dyes, will not sensitize Photopolymer A.

The invention has been described in detail with particular reference to preferred embodiments thereof, but it will be understood that variations and modifications can be effected within the spirit and scope of the invention.

What is claimed is:

1. A presensitized light-sensitive plate suitable for the production of a lithographic printing plate, comprising a support and applied to the support, a layer comprising a photocrosslinkable unsaturated polymer containing as part of the polymer backbone the moiety,

in recurring amounts sufficient to render the layer photocrosslinkable, a thiazoline sensitizer for said polymer, a leuco dye, and a light-sensitive organic azide different from said sensitizer and capable of sensitizing said leuco dye without reducing the speed of said plate by more than one step, said azide having a formula selected from the group consisting of

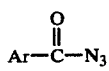 (I)

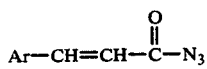 (II)

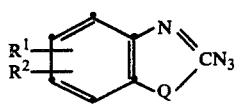 (III)

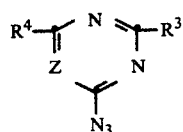 (IV)

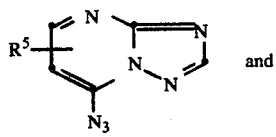 (V) and

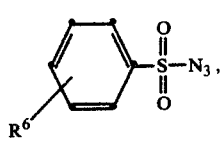 (VI)

wherein Ar represents aryl; Q is selected from the class consisting of oxygen, sulfur, selenium, and a >NR radical; R is selected from the class consisting of hydrogen, alkyl, aryl, alkylsulfonyl, arylsulfonyl, alkoxy, aroyl, carbalkoxy, and carbamyl; $R^1$ and $R^2$ each is selected from the class consisting of hydrogen, alkyl, alkoxy, aryl, nitro, halogen, and the nonmetallic atoms such that when the $R^1$ and $R^2$ groups are attached to adjacent carbon atoms in the benzene ring, said $R^1$ and $R^2$ groups when taken together with said carbon atoms complete a fused cyclic ring; $R^3$ is selected from the class consisting of azido and alkyl; $R^4$ is selected from the class consisting of azido, alkyl, and amido; Z is selected from the class consisting of the →CH radical and nitrogen; $R^5$ is selected from the class consisting of hydrogen and alkyl; and $R^6$ is acyl containing from 2 to 5 carbon atoms.

2. A plate as defined in claim 1 in which said organic azide has the structure:

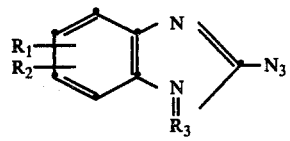

wherein $R_1$ and $R_2$ each is selected from the class consisting of H, alkyl of 1 to 10 carbon atoms, aryl having 6 to 10 carbons, nitro, halogen, and non-metallic atoms such that when $R_1$ and $R_2$ are attached to adjacent carbon atoms in the benzene ring, $R_1$ and $R_2$ can together with said adjacent carbon atoms form a fused cyclic ring; and $R_3$ represents carbamyl having 2 to 20 carbon atoms.

3. A plate as defined in claim 2 in which said organic azide is 1-(carbobutoxymethylcarbamyl)-2-azidobenzimidazole.

4. A plate as defined in claim 1, wherein said organic azide is 4-acetamidobenzenesulfonylazide.

5. A plate as defined in claim 1, wherein said organic azide is 4-azido-6-methyl-1,3,3a,7-tetrazaindene.

6. A plate as defined in claim 1, wherein said organic azide is cinnamoylazide.

7. A plate as defined in claim 1 in which said leuco dye is the leuco base of an arylmethane dye.

8. A plate as defined in claim 7, wherein said leuco dye is leuco crystal violet.

9. A plate as defined in claim 1 in which said leuco dye has the formula:

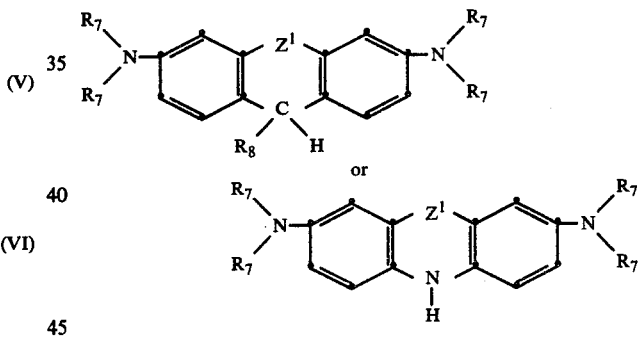

wherein each $R_7$ is independently H, lower alkyl or aryl and $R_8$ is selected from the group consisting of H, alkyl and aryl, and $Z^1$ represents a member selected from the group consisting of >O, >S, >Se, >NH, and

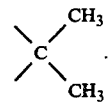

10. A plate as defined in claim 9, wherein said leuco dye is selected from the group consisting of 3,6-bis(dimethylamino)-9-(p-dimethylaminophenyl)xanthene, 3,6-bis(diethylamino)-9-(p-dimethylaminophenyl)xanthene, 3,6-bis(diethylamino)-9-(p-diethylaminophenyl)xanthene, 3,6-bis(dimethylamino)-9-(p-dimethylaminophenyl)thioxanthene, and 2,7-bis(dimethylamino)-10-p-dimethylaminophenyl-9,10-dihydro-9,9-dimethylanthracene.

11. A plate as defined in claim 1, wherein said polymer is a polyester containing at least one saturated carbocyclic ring in the repeating unit of the polymer.

12. A plate as defined in claim 1, wherein said thiazoline sensitizer is selected from the group consisting of 3-ethyl-2-benzoylmethylenenaphtho[1,2-d]-thiazoline, 2-[bis(2-furoyl)methylene]-1-methylnaphtho[1,2-d]thiazoline; benzothiazoline, (2-benzoylmethylene)-1-methyl-betanaphthothiazoline; 1,2-dihydro-1-ethyl-2-phenacrylidenenaphtho[1,2-d]thiazole; and naphthothiazoline.

13. A presensitized light-sensitive plate suitable for the production of a lithographic printing plate, comprising a support and applied to the support, a layer comprising a photocrosslinkable unsaturated polymer containing as part of the polymer backbone the moiety,

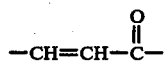

in recurring amounts sufficient to render the layer photocrosslinkable, a thiazoline sensitizer for said polymer, and
a leuco dye selected from one having the formula

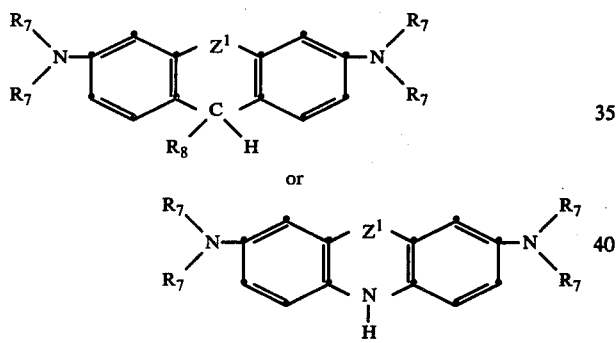

wherein each $R_7$ is independently H, lower alkyl or aryl and $R_8$ is selected from the group consisting of H, alkyl and aryl, and $Z^1$ represents a member selected from the group consisting of $>O$, $>S$, $>Se$, $>NH$, and

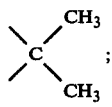

and as a sensitizer for said dye different from said polymer sensitizer, 1-(carbobutoxymethylcarbamyl)-2-azidobenzimidazole.

14. A presensitized light-sensitive plate suitable for the production of a lithographic printing plate, comprising a support and applied to the support, a layer comprising a polymer containing a recurring unit of the formula

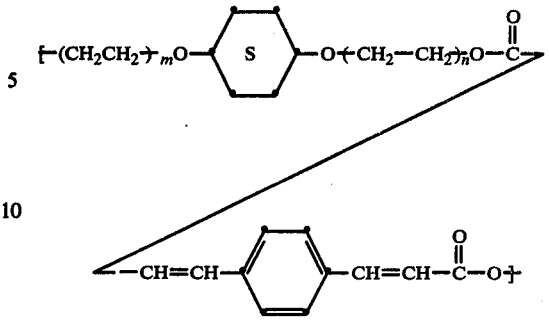

where m and n are the same or different and are equal to 1, 2 or 3, said unit recurring in amounts sufficient to render the layer photocrosslinkable;

a thiazoline sensitizer for said polymer,
a leuco dye, and
a light-sensitive organic azide different from said sensitizer, and capable of sensitizing said leuco dye without reducing the speed of said plate by more than one step, said azide having a formula selected from the group consisting of

           (I)

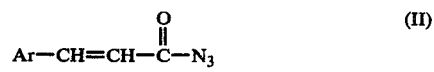           (II)

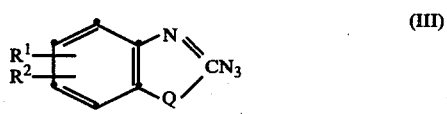           (III)

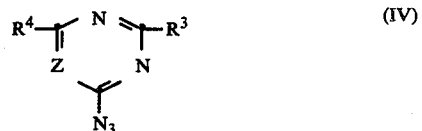           (IV)

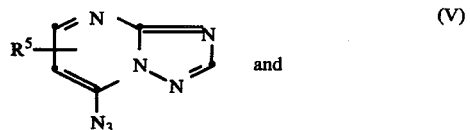           (V)

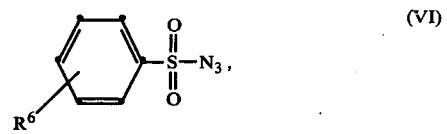          (VI)

wherein Ar represents aryl; Q is selected from the class consisting of oxygen, sulfur, selenium, and a $>NR$ radical; R is selected from the class consisting of hydrogen, alkyl, aryl, alkylsulfonyl, arylsulfonyl, alkoxy, aroyl, carbalkoxy, and carbamyl; $R^1$ and $R^2$ each is selected from the class consisting of hydrogen, alkyl, alkoxy, aryl, nitro, halogen, and the nonmetallic atoms such that when the $R^1$ and $R^2$ groups are attached to adjacent carbon atoms in the benzene ring, $R^1$ and $R^2$ groups when taken together with said carbon atoms complete a fused cyclic ring; $R^3$ is selected from the class consisting of azido and alkyl; $R^4$ is selected from the class consisting of azido, alkyl, and amido; Z is selected from the class consisting of the →CH radical and nitrogen; $R^5$ is selected from the class consisting of hydrogen and alkyl; and $R^6$ is acyl containing from 2 to 5 carbon atoms.

15. A plate as defined in claim 14, wherein said dye is selected from one having the formula

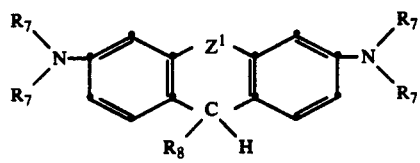

or

-continued

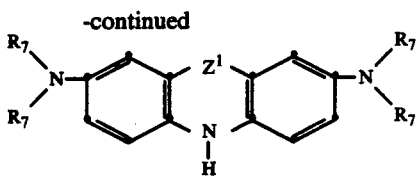

wherein each $R_7$ is independently H, lower alkyl or aryl and $R_8$ is selected from the group consisting of H, alkyl and aryl, and $Z^1$ represents a member selected from the group consisting of >O, >S, >Se, >NH, and

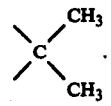

* * * * *

UNITED STATES PATENT AND TRADEMARK OFFICE
CERTIFICATE OF CORRECTION

PATENT NO. : 4,139,390

DATED : February 13, 1979

INVENTOR(S) : Frederick J. Rauner, Michael P. Cunningham and Richard C. VanHanehem It is certified that error appears in the above-identified patent and that said Letters Patent are hereby corrected as shown below:

Column 1, line 35, ")benzyhydro]" should read --)benzhydrol]--; line 39, after "selected" and before "such", "from" should read --for--.

Column 3, line 10, " →CH" should read -- >CH --; line 10, "radial" should read --radical--.

Column 7, line 53, "(P-methoxyphenyl)-" should read --(p-methoxyphenyl)- --.

Column 9, line 20, "(p-dimethylaminophenyl))" should read --(p-dimethylaminophenyl)--.

Column 15, line 28, "formamides" should read --formamide--.

Column 19, line 9, "of of Example" should read --of Example--.

Column 21, line 64 (claim 1), " →CH" should read -- >CH --.

UNITED STATES PATENT AND TRADEMARK OFFICE
CERTIFICATE OF CORRECTION

PATENT NO. : 4,139,390   Page 2 of 2
DATED : February 13, 1979
INVENTOR(S) : Frederick J. Rauner, Michael P. Cunningham and Richard C. VanHanehem It is certified that error appears in the above-identified patent and that said Letters Patent are hereby corrected as shown below:

Column 22, claim 2, formula at line 5,

" $\overset{\underset{\|}{N}}{R_3}$ " should read -- $\overset{\underset{|}{N}}{R_3}$ --

Column 25, line 1 (claim 14), " →CH" should read -- ⇒CH --.

*Signed and Sealed this*

*Twenty-ninth* Day of *May 1979*

[SEAL]

Attest:

RUTH C. MASON
*Attesting Officer*

DONALD W. BANNER
*Commissioner of Patents and Trademarks*